United States Patent
Kato et al.

(10) Patent No.: US 6,180,742 B1
(45) Date of Patent: Jan. 30, 2001

(54) PRESSURE SENSITIVE ADHESIVE COMPOSITION AND USE THEREOF

(75) Inventors: Kiichiro Kato; Takeshi Kondoh, both of Urawa; Kazuhiro Takahashi, Kawaguchi, all of (JP)

(73) Assignee: Lintec Corporation, Tokyo (JP)

( * ) Notice: Under 35 U.S.C. 154(b), the term of this patent shall be extended for 0 days.

(21) Appl. No.: 09/022,573

(22) Filed: Feb. 12, 1998

(30) Foreign Application Priority Data

Feb. 14, 1997 (JP) .................................... 9-030172

(51) Int. Cl.⁷ .................................... C08F 220/10
(52) U.S. Cl. ............. 526/328.5; 526/210; 526/211; 526/217; 526/220; 526/329.2; 526/329.3
(58) Field of Search ................... 526/210, 211, 526/217, 220, 328.5, 329.2, 329.3

(56) References Cited

U.S. PATENT DOCUMENTS 5,508,107  4/1996  Gutman et al. .................. 428/339

FOREIGN PATENT DOCUMENTS 0252739  6/1993  (EP) .
0530729  10/1993 (EP) .

OTHER PUBLICATIONS

Japanese Patent Publication No. 62–101678 Abstract, May 12, 1987, 1 p., English language.
Japanese Patent Publication No. 06184508, Abstract, Jul. 5, 1994, 1 p., English language.
Japanese Patent Publication No. 07173445, Abstract, Jul. 11, 1995, 1 p., English language.

*Primary Examiner*—Helen L. Pezzuto
(74) *Attorney, Agent, or Firm*—Webb Ziesenheim Logsdon Orkin & Hanson, P.C.

(57) ABSTRACT

A pressure sensitive adhesive composition comprising:

(A) a carboxyl group containing copolymer obtained by solution polymerization of (a) a carboxyl group containing polymerizable monomer and (b) another monomer copolymerizable with the monomer (a);

(B) a neutralizer; and (C) a crosslinking agent. This pressure sensitive adhesive composition is suitable for use in a wafer surface protective sheet employed for protecting a circuit pattern formed on a wafer surface from cutting debris, etc. at the time of polishing the back of the wafer. When this pressure sensitive adhesive composition is used, not only is the voltage of peel electrification extremely low at the time of stripping of the pressure sensitive adhesive sheet but also, even if the pressure sensitive adhesive remains on the wafer surface, the residual pressure sensitive adhesive can easily be removed by washing with water.

2 Claims, No Drawings

PRESSURE SENSITIVE ADHESIVE COMPOSITION AND USE THEREOF

FIELD OF THE INVENTION

The present invention relates to a pressure sensitive adhesive composition and a use thereof. More particularly, the present invention is concerned with a pressure sensitive adhesive composition which is suitable for use in a wafer surface protective pressure sensitive adhesive sheet employed for protecting a circuit pattern formed on a wafer surface from cutting debris, etc. at the time of polishing the back of the wafer and is concerned with such a use of the pressure sensitive adhesive composition.

BACKGROUND OF THE INVENTION

A circuit pattern is formed on a surface of a semiconductor wafer of, for example, silicon or gallium arsenide by the etching or lift off method. The wafer having patterned surface generally has its back polished by, for example, a grinder while having the patterned surface protected by a pressure sensitive adhesive sheet applied thereto. The objective of polishing the back of the patterned wafer is first to remove any oxide layer which may be formed on the wafer back in the etching conducted during the patterning and second to regulate the thickness of the patterned wafer.

The polishing of the back of the wafer having patterned surface is conducted while washing the wafer back with purified water in order to remove any generated polishing debris and in order to remove heat generated during the polishing. In the polishing of the wafer back, a pressure sensitive adhesive sheet (surface protective sheet) is stuck to the wafer surface for the purpose of protecting the pattern formed on the wafer surface from the polishing debris. After the completion of the polishing of the wafer back, the pressure sensitive adhesive sheet is stripped from the wafer surface. At the time of the stripping, it has been inevitable for part of the pressure sensitive adhesive to remain on the patterned wafer surface. Thus, it has been necessary to wash away the remaining pressure sensitive adhesive from the wafer surface. Although washing with the use of an organic solvent has been carried out for removing pressure sensitive adhesive which remains adhering to the wafer surface, it is now the mainstream practice to conduct the washing with the use of purified water in view of the consideration of environmental protection and other problems. Accordingly, the pressure sensitive adhesive which can be washed away by water is increasingly used in the above surface protective sheet.

Examples of pressure sensitive adhesive compositions for use in the above pressure sensitive adhesive sheet include those based on nonionic surfactants described in Japanese Patent Laid-open Publication Nos. 62(1987)-101678 and 63(1988)-153814 and water swellable pressure sensitive adhesive compositions described in Japanese Patent Publication No. 5(1993)-77284.

In the use of the former pressure sensitive adhesive compositions, use is made of nonionic surfactants whose molecular weight is relatively low, so that they would become the cause of residue on the wafer surface after the stripping of the pressure sensitive adhesive sheet thereby inviting the possibility of adversely affecting the circuit surface of the wafer. Such a low molecular weight component would not always be entirely removed even if the washing away operation is conducted. The surfactants employed in the above use are not those intended for antistatic performance, so that a peel electrification occurs at the time of stripping of the pressure sensitive adhesive sheet after completion of the polishing. Thus, the antistatic characteristics of the pressure sensitive adhesive compositions based on nonionic surfactants are not satisfactory.

On the other hand, the latter pressure sensitive adhesive compositions do not use surfactants and are water swellable, which include, for example, a blend of a water soluble polymer and a (meth)acrylic polymer. The molecular weights of the water soluble polymers generally used in these compositions are smaller than those of the (meth)acrylic polymers. Thus, an adhesive residue would occur on the wafer surface after the stripping of the pressure sensitive adhesive sheet. Further, the washing away of (meth)acrylic polymers is not easy although the water soluble polymers can easily be removed by washing with water.

OBJECT OF THE INVENTION

It is an object of the present invention to provide a pressure sensitive adhesive composition which is suitable for use in a wafer surface protective sheet employed for protecting a circuit pattern formed on a wafer surface from cutting debris, etc. at the time of polishing the back of the wafer.

It is another object of the present invention to provide a pressure sensitive adhesive composition suitable for use in a wafer surface protective sheet, which exhibits an extremely low peel electrification voltage at the time of stripping of the pressure sensitive adhesive sheet and which, even if it remains on the wafer surface, can easily be removed by washing with water.

SUMMARY OF THE INVENTION

The pressure sensitive adhesive composition of the present invention comprises:

(A) a carboxyl group containing copolymer obtained by solution polymerization of (a) a carboxyl group containing polymerizable monomer and (b) another monomer copolymerizable with the monomer (a);

(B) a neutralizer; and (C) a crosslinking agent.

In this pressure sensitive adhesive composition, it is preferred that the other monomer (b) be a compound represented by the formula:

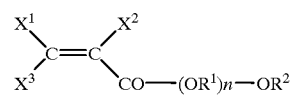

wherein each of $X^1$, $X^2$ and $X^3$ independently represents a hydrogen atom or a methyl group, $R^1$ represents a divalent hydrocarbon group having 2 to 12 carbon atoms, $R^2$ represents a hydrocarbon group having 1 to 10 carbon atoms, and n is a number of 1 to 10.

The pressure sensitive adhesive sheet of the present invention comprises a substrate and, superimposed thereon, a pressure sensitive adhesive layer composed of the above pressure sensitive adhesive composition. This pressure sensitive adhesive sheet is preferably used in wafer processing.

The above pressure sensitive adhesive sheet is preferably used in a method of polishing a back of a wafer, which comprises the steps of:

sticking the pressure sensitive adhesive sheet to a wafer surface having a pattern formed thereon; and polishing the back of the wafer while feeding water thereto.

The pressure sensitive adhesive composition of the present invention is a solvent type and is a water soluble (water swellable) composition containing no surfactant. Hydrophilicity is imparted to the pressure sensitive adhesive polymer per se, so that the pressure sensitive adhesive composition is excellent in water washability and exhibits an extremely low peel electrification voltage at the time of stripping of the pressure sensitive adhesive sheet. Moreover, water solubility (water swellability) is imparted to the pressure sensitive adhesive composition of the present invention without executing a blending of a water soluble polymer and a (meth)acrylic polymer, so that an adhesive residue is extremely little at the time of stripping of the pressure sensitive adhesive sheet.

DETAILED DESCRIPTION OF THE INVENTION

The pressure sensitive adhesive composition and use thereof according to the present invention will be described in detail below.

The pressure sensitive adhesive composition of the present invention comprises (A) a carboxyl group containing copolymer, (B) a neutralizer and (C) a crosslinking agent.

(A) Carboxyl Group Containing Copolymer

This carboxyl group containing copolymer (A) is obtained by polymerizing (a) a carboxyl group containing polymerizable monomer and (b) another monomer copolymerizable with the monomer (a) according to a solution polymerization.

The carboxyl group containing polymerizable monomer (a) is a monomer having a polymerizable carbon-carbon double bond and one or more of carboxyl group. This monomer is, for example, selected from among acrylic acid, methacrylic acid, crotonic acid, itaconic acid, maleic acid, fumaric acid, monoalkylitaconic acids, monoalkylmaleic acids and monoalkylfumaric acids. Among these, acrylic acid and methacrylic acid are especially preferred in the present invention. These carboxyl groups containing polymerizable monomers can be used either individually or in combination.

The other monomer (b) which is copolymerizable with the above carboxyl group containing polymerizable monomer is not particularly limited as long as it is a compound having at least one polymerizable carbon-carbon double bond. Various monomers can be used as the other monomer (b), among which preferred use is made of the compound represented by the formula:

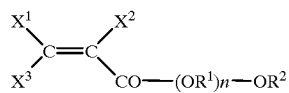

In the formula, each of $X^1$, $X^2$ and $X^3$ independently represents a hydrogen atom or a methyl group, preferably, a hydrogen atom, n is a number of 1 to 10, preferably, 1 to 4.

$R^1$ represents a divalent hydrocarbon group having 2 to 12 carbon atoms, preferably, an alkylene having 2 to 5 carbon atoms, such as ethylene, n-propylene, isopropylene, n-butylene, isobutylene, tert-butylene, sec-butylene or n-pentylene.

Of these, it is especially preferred that ethylene, n-propylene, n-butylene or tert-butylene be used as $R^1$.

$R^2$ represents a hydrocarbon group having 1 to 10 carbon atoms, preferably, an alkyl having 1 to 6 carbon atoms such as methyl, ethyl, n-propyl, isopropyl, n-butyl, isobutyl, tert-butyl, sec-butyl, n-pentyl, isopentyl, neopentyl or n-hexyl.

Of these, it is especially preferred that ethyl, n-propyl, isopropyl, n-butyl, isobutyl or tert-butyl be used as $R^2$.

Therefore, an alkoxyl group containing (meth)acrylic acid ester such as 2-methoxyethyl (meth)acrylate, 2-ethoxyethyl (meth)acrylate, 3-methoxybutyl (meth)acrylate, 2-butoxyethyl (meth)acrylate, methoxydiethylene glycol (meth)acrylate or ethoxydiethylene glycol (meth)acrylate is especially preferably used as the monomer (b) in the present invention.

The above alkoxyl group containing (meth)acrylic acid esters can be used either individually or in combination.

In addition to the above alkoxyl group containing (meth) acrylic acid esters, there can be used other suitable monomers (b) such as (meth)acrylic acid esters containing an alkyl group having 1 to 18 carbon atoms, 2-hydroxyethyl (meth)acrylate, 2-hydroxypropyl (meth)acrylate and N,N-dimethylaminoethyl (meth)acrylate, N,N-dimethylacrylamide, N,N-diethylacrylamide, N,N-dimethylaminopropylacrylamide, N,N-diethylaminopropylacrylamide, N,N-di-n-butoxymethylacrylamide, acryloylmorpholine, vinyl acetate, styrene, acrylonitrile, glycidyl (meth)acrylate, methylolacrylamide, vinylpyrrolidone, vinyl methyl ether, maleic anhydride, ethylene oxide and glycosyloxyethyl (meth)acrylate. It is especially preferred that these monomers be used in combination with the alkoxyl group containing (meth)acrylic acid ester. When this combination is effected, the ratio of alkoxyl group containing (meth)acrylic acid ester to other polymerizable monomer (weight ratio) preferably ranges from about 1/20 to 99/1.

In the carboxyl group containing copolymer (A) for use in the present invention, the ratio of carboxyl group containing polymerizable monomer (a) to another monomer (b) copolymerizable with the monomer (a) (weight ratio of (a)/(b)) preferably ranges from 1/500 to 1/4, still preferably, 1/100 to 1/10. The weight average molecular weight of the carboxyl group containing copolymer (A) preferably ranges from 50 thousand to 1500 thousand, still preferably, from 100 thousand to 1000 thousand.

The carboxyl group containing copolymer (A) for use in the present invention is obtained by copolymerizing the above carboxyl group containing polymerizable monomer (a) and other monomer (b) copolymerizable with the monomer (a). The copolymerization is conducted according to the solution polymerization process.

This solution polymerization is conducted by adding appropriate amounts of a solvent such as ethyl acetate and an initiator such as azobisisobutyronitrile to a mixture of the above monomers (a) and (b), agitating the mixture at room temperature for about 30 min under a nitrogen stream and carrying out a reaction at 40 to 100° C. for about 4 to 5 hr. This solution polymerization is advantageous in that not only can the amount of impurity ions be reduced because neither emulsifier nor thickener agent is needed as compared with the emulsion polymerization process but also the control of polymerization conditions and changing of the composition of obtained polymer can be facilitated. Moreover, a surprising effect such that the polymer obtained by the solution polymerization process is stronger in the load along a shearing direction than the polymer obtained by the emulsion polymerization process is attained.

The above carboxyl group containing copolymers (A) can be used either individually or in combination.

(B) Neutralizer

The neutralizer (B) is used for neutralizing part or all of the carboxyl groups of the above carboxyl group containing copolymer (A) so that a hydrophilicity or water solubility is imparted to the carboxyl group containing copolymer (A). Using a compound containing neither metal nor halogen in its molecule as the neutralizer (B) is preferred from the viewpoint of ionic impurities which are detrimental to wafers. Although various basic compounds can be used, it is preferred in the present invention that use be made of unsubstituted or substituted amines, especially, water soluble amine compounds.

Examples of such amine compounds include ammonia, alkaline ammonium salts, and alkaline organic amino compounds including primary amines such as monoethylamine and monoethanolamine, secondary amines such as diethylamine and diethanolamine, tertiary amines such as triethylamine, triethanolamine, N,N,N'-trimethylethylenediamine, N-methyldiethanolamine, N,N-diethylhydroxylamine and N,N-dimethylformamide diethylacetal, amino compounds having a plurality of Ns in each molecule thereof such as diamine and polyethyleneimine, and cyclic amino compounds such as pyridine.

Triethanolamine and N,N-dimethylformamide diethylacetal are preferably used in the present invention.

The above neutralizers can be used either individually or in combination.

The neutralizer (B) is preferably used in an amount of 0.0001 to 1 mol, still preferably, 0.01 to 0.5 mol per mol of carboxyl group of the above carboxyl group containing copolymer (A).

(C) Crosslinking Agent

The crosslinking agent (C) is used for partially crosslinking the above carboxyl group containing copolymer (A). Examples of suitable crosslinking agents (C) include epoxy crosslinking agents composed of a compound containing a glycidyl group in its molecule such as neopentyl glycol diglycidyl ether, polyethylene glycol diglycidyl ether, bisphenol A diglycidyl ether, bisphenol F diglycidyl ether, phthalic acid diglycidyl ester, dimer acid diglycidyl ether, triglycidyl isocyanurate, diglycerol triglycidyl ether, sorbitol tetraglycidyl ether, N,N,N',N'-tetraglycidyl-m-xylenediamine, 1,3-bis(N,N-diglycidylaminomethyl)cyclohexane and N,N,N',N'-tetraglycidyldiaminodiphenylmethane, isocyanate crosslinking agents composed of a compound containing an isocyanate group in its molecule such as toluene diisocyanate and diphenylmethane diisocyanate, methylol crosslinking agents such as melamine and phenol, chelate crosslinking agents and aziridine crosslinking agents.

The partially crosslinking of the carboxyl group containing copolymer (A) with the use of the crosslinking agent (C) enables regulating the peel strength of obtained pressure sensitive adhesive to appropriate value and enables obtaining a pressure sensitive adhesive which is not dissolved in water but swells therein.

The crosslinking agent (C) is preferably used in an amount of 0.001 to 1.0 mol, still preferably, 0.01 to 0.75 mol per mol of carboxyl of the above carboxyl group containing copolymer (A).

Other Components

Although the pressure sensitive adhesive composition of the present invention comprises the above components (A) to (C) as principal components, according to necessity, a hydrophilic plasticizer such as a water soluble polyhydric alcohol, a tackifier resin, a pigment, a dye, an antifoaming agent, an antiseptic, etc. can be added in amounts not detrimental to the object of the present invention in order to regulate the adhesive strength, cohesive strength, tack, molecular weight, molecular weight distribution, elasticity, glass transition temperature, hydrophilicity, water resistance, etc. of the pressure sensitive adhesive. Each of these other components is preferably used in an amount of about 0.01 to 20 parts by weight per 100 parts by weight of the total of components (A) to (C), although depending on the purpose of adding the same.

Production of Pressure Sensitive Adhesive Composition

The pressure sensitive adhesive composition of the present invention is obtained by appropriately mixing together the above components (A) to (C) and other components added if desired. Preferably, the carboxyl group containing copolymer (A) is first mixed with the neutralizer (B) and then the crosslinking agent (C) is added to thereby crosslink the carboxyl group containing copolymer (A). In this process, the addition of other components may be carried out at any stage of the process.

The mixing of the carboxyl group containing copolymer (A) with the neutralizer (B) is carried out, for example, by adding the neutralizer (B) as it is or diluted with a solvent (e.g., alcohol or acetone) to the carboxyl group containing copolymer (A) at room temperature and agitating the mixture at 5 to 40° C. for at least 25 min.

Further, the crosslinking agent (C) as it is or diluted with a solvent (e.g., toluene, ethyl acetate or isopropyl alcohol) is added to the thus obtained mixture at room temperature and agitated at 5 to 40° C. for at least 5 min. Thus, the pressure sensitive adhesive composition of the present invention is obtained.

The thus obtained pressure sensitive adhesive composition is a solvent type and is a water soluble (water swellable) composition containing no surfactant. Hydrophilicity is imparted to the pressure sensitive adhesive polymer per se, so that the pressure sensitive adhesive composition is excellent in water washability and exhibits an extremely low peel electrification voltage at the time of stripping of the pressure sensitive adhesive sheet. Moreover, water solubility (water swellability) is imparted to the pressure sensitive adhesive composition of the present invention without executing a blending of a water soluble polymer and a (meth)acrylic polymer, so that an adhesive residue is extremely little at the time of stripping of the pressure sensitive adhesive sheet.

Pressure Sensitive Adhesive Sheet

The pressure sensitive adhesive sheet of the present invention comprises a pressure sensitive adhesive layer of the above pressure sensitive adhesive composition and a substrate.

The substrate is not particularly limited. Examples of suitable substrates include a polyethylene film, a polypropylene film, a polybutene film, a polybutadiene film, a polymethylpentene film, a polyvinyl chloride film, a vinyl chloride copolymer film, a polyethylene terephthalate film, a polybutylene terephthalate film, a polyurethane film, an ethylene/vinyl acetate copolymer film, an ionomer resin film, an ethylene/(meth)acrylic acid copolymer film, an ethylene/(meth)acrylic acid ester copolymer film, a polystyrene film and a polycarbonate film and also crosslinked films therefrom. The substrate may further be any of laminate films therefrom. Moreover, according to necessity, the above films may be colored, and use can be made of fluororesin films and the like.

The pressure sensitive adhesive sheet of the present invention is obtained by applying the above pressure sensitive adhesive composition onto any of various substrates in an appropriate thickness by customary means such as a comma coater, a gravure coater, a die coater or a reverse coater, drying the coating to thereby form a pressure sensitive adhesive layer and, if desired, sticking a release sheet onto the pressure sensitive adhesive layer.

Although largely varied depending on the use, the thickness of the pressure sensitive adhesive layer generally ranges from about 10 to 50 μm, preferably, from about 20 to 40 μm. The use of a pressure sensitive adhesive layer whose thickness is too small is likely to invite a deterioration of surface protective function. On the other hand, the thickness of the substrate generally ranges from about 50 to 500 μm, preferably, from about 80 to 300 μm. The use of a substrate whose thickness is too small is likely to invite a deterioration of surface protective function.

The pressure sensitive adhesive sheet of the present invention can be shaped into a tape, a label and any other various forms.

The pressure sensitive adhesive sheet of the present invention is preferably used for protecting the surface of, for example, various electronic components.

Namely, the pressure sensitive adhesive containing the above components swells upon being brought into contact with water and exhibits excellent water sealing properties. As a result, the entry of, for example, polishing and cutting debris into a space between the pressure sensitive adhesive layer and an adherend surface is prevented to thereby enable satisfactorily protecting the adherend surface. Moreover, the adherend can easily be separated from the pressure sensitive adhesive layer after the completion of required processing, so that a wafer breakage can be prevented at the time of the separation. Further, the peel electrification voltage is so low at the time of the separation that there is no adverse effect on the properties of the electronic components. Still further, even if the pressure sensitive adhesive remains adhered to the adherend surface, it can easily be washed away with water.

Use

The above pressure sensitive adhesive sheet of the present invention can suitably be used as, in particular, a surface protective sheet in wafer processing. A method of polishing a wafer back with the use of the pressure sensitive adhesive sheet of the present invention will be described below.

When a release sheet is disposed on an upper surface of the pressure sensitive adhesive sheet, the release sheet is removed and one side of a wafer whose back is to be polished is stuck to the pressure sensitive adhesive layer. The wafer side to be contacted with and stuck to the pressure sensitive adhesive layer is a wafer surface having a pattern formed thereon.

In this state the wafer back is polished by, for example, a grinder to thereby not only remove any oxide film formed on the wafer back but also adjust the thickness of the wafer to a desired one. During the polishing, for example, purified water is sprayed to the wafer to thereby not only wash away polishing debris of wafer but also remove heat generated by the polishing.

After the completion of the polishing, the pressure sensitive adhesive sheet is stripped from the wafer. The pressure sensitive adhesive sheet of the present invention enables reducing the peel electrification voltage to an extremely low level as mentioned above, so that no adverse effect occurs on the circuit arranged on the wafer surface at the time of stripping of the pressure sensitive adhesive sheet.

Even if the pressure sensitive adhesive remains adhered to the wafer surface after the stripping of the pressure sensitive adhesive sheet, the residual pressure sensitive adhesive can easily be washed away with purified water.

As is apparent from the above, the pressure sensitive adhesive layer of the pressure sensitive adhesive sheet of the present invention comprises the pressure sensitive adhesive composition containing the specified components, so that the exhibited peel electrification voltage is low with the result that there is no detriment to the circuit at the time of stripping of the pressure sensitive adhesive sheet. Even if the pressure sensitive adhesive remains adhered to the wafer surface, it can be washed away with purified water without the need to use an organic solvent such as trichlene. Therefore, there is no danger of having an unfavorable influence on the human body or polluting the environment. Although the prior art requires two steps of first washing a wafer surface having the pressure sensitive adhesive adhering thereto with an organic solvent such as trichlene and thereafter washing with purified water, the washing of the present invention can be performed by only one step of washing the wafer surface having the pressure sensitive adhesive adhering thereto with purified water by means of, for example, an ultrasonic washer. Furthermore, the pressure sensitive adhesive sheet of the present invention is stuck to the wafer with a satisfactory bonding strength when the wafer back is polished, thereby preventing polishing debris of wafer from entering a space between the wafer surface and the pressure sensitive adhesive sheet and damaging the pattern formed on the wafer surface.

EFFECT OF THE INVENTION

The pressure sensitive adhesive composition of the present invention is a solvent type and is a water soluble (water swellable) composition containing no surfactant. Hydrophilicity is imparted to the pressure sensitive adhesive polymer per se, so that the pressure sensitive adhesive composition is excellent in water washability and exhibits an extremely low peel electrification voltage at the time of stripping of the pressure sensitive adhesive sheet. Moreover, water solubility (water swellability) is imparted to the pressure sensitive adhesive composition of the present invention without executing a blending of a water soluble polymer and a (meth)acrylic polymer, so that an adhesive residue is extremely little at the time of stripping of the pressure sensitive adhesive sheet.

EXAMPLE

The present invention will be illustrated in detail below with reference to the following Examples, which in no way limit the scope of the invention.

In the following Examples and Comparative Examples, the "residual particles", "water washability", "water resistance", "adhesive strength", "impurity ions" and "peel electrification" were evaluated in the following manners.

Measuring of Residual Particles

A 4-inch silicon wafer was stuck to the pressure sensitive adhesive sheet prepared in each of the Examples and Comparative Examples and allowed to stand still for one hour, and the pressure sensitive adhesive sheet was stripped from the wafer. The number of particles which remain adhered to the wafer surface and have a diameter of at least 0.27 μm was measured by means of a laser surface tester (LS 5000 manufactured by Hitachi Electronics Engineering Co., Ltd.). The criteria indicated in the Tables are as follows:

good: <100,
fair: 100 to 200, and
failure: >200.

Water Washability

A 50 μm thick coating of the pressure sensitive adhesive obtained in each of the Examples and Comparative Examples was formed, dried, cut into 20 mm squares and stuck to mirror wafers. Each of the mirror wafers with the coating was immersed in pure water at room temperature, and the time spent for the peeling of the pressure sensitive adhesive coating was measured. The criteria indicated in the Tables are as follows:

good: <10 min, fair: 10 to 30 min, and failure: >30 min.

Water Resistance

The pressure sensitive adhesive sheet obtained in each of the Examples and Comparative Examples was cut into 20 mm squares and stuck to mirror wafers. Each of the mirror wafers with the sheet was immersed in pure water at room temperature, and the time spent for the peeling of the pressure sensitive adhesive sheet was measured. The criteria indicated in the Tables are as follows:

good: >30 hr, fair: 30 to 15 hr, and failure: <15 hr.

Adhesive Strength

In an atmosphere of 23° C. and 65% RH, the pressure sensitive adhesive sheet obtained in each of the Examples and Comparative Examples was stuck to the mirror surface of a SUS 304 by reciprocating a 2 kg rubber roller and allowed to stand still for 20 min. The 180° peeling adhesive strength (g/25 mm) thereof was measured at a peeling speed of 300 mm/min by the use of universal tensile tester (trade name: TENSILON/UTM-4-100, manufactured by Orientec Corporation). The criteria indicated in the Tables are as follows:

good: 50 to 200, fair: 200 to 250, and failure: >250.

Impurity Ions

100 $cm^2$ of the pressure sensitive adhesive sheet was immersed in 50 ml of pure water and extracted at 100° C. for 30 min. Thereafter, the amount of cations and anions contained in the extraction water was measured by the use of ion chromatoanalyzer IC 500P (manufactured by Yokogawa Electric Corporation). The criteria indicated in the Tables are as follows:

good: <0.5 ppm, fair: 0.5 to 1 ppm, and failure: >1 ppm.

Peel Electrification

The pressure sensitive adhesive sheet was stuck to a nonelectrified silicon wafer (mirror side) and peeled at a speed of 1000 mm/min. The peel electrification voltage of the wafer was measured immediately after the peeling.

Measuring atmosphere: 23° C., 65% RH, and

Instrument: KSD-0101 (manufactured by Kasuga Electric Co., Ltd.). The criteria indicated in the Tables are as follows:

good: <100 V, fair: 100 to 300 V, and failure: >300 V.

The abbreviations employed in the Tables are as follows:

under the heading "Carboxyl group containing copolymer (A)"

(a) carboxyl group containing polymerizable monomer

AA: acrylic acid,

MAA: methacrylic acid, (b) other monomer copolymerizable with the monomer (a)

2-MEA: 2-methoxyethyl acrylate,

BA: butyl acrylate,

DMAEA: N,N-dimethylaminoethyl acrylate,

VAc: vinyl acetate,

AN: acrylonitrile, under the heading "Neutralizer (B)"

TEA: triethanolamine,

DMFAEA: N,N-dimethylformamide diethylacetal, under the heading "Crosslinking agent (C)"

epoxy type: 1,3-bis(N,N-diglycidylaminomethyl) cyclohexane, melamine type: hexamethoxymethylmelamine, under the heading "Other Component (D)"

D1: polydioxolane (hydrophilic polymer), and

D2: diethylene glycol monobutyl ether (nonionic surfactant).

Example 1

Preparation of Pressure Sensitive Adhesive Composition (1) Production of carboxyl group containing copolymer:

3 parts by weight of acrylic acid, 90 parts by weight of 2-methoxyethyl acrylate, 7 parts by weight of butyl acrylate, 200 parts by weight of ethyl acetate and 0.5 part by weight of azobisisobutyronitrile were placed in a four necked flask equipped with a reflux condenser, an agitator, a thermometer, an inert gas introducing tube and a dropping funnel. The mixture was agitated for 30 min in a nitrogen stream and reacted at 80° C. for 5 hr, thereby obtaining a carboxyl group containing copolymer.

(2) Production of Pressure Sensitive Adhesive Composition:

An appropriate amount of diluents such as toluene, ethyl acetate and isopropyl alcohol and, subsequently, 0.5 part by weight of triethanolamine as a neutralizer (0.2 mol per mol of carboxyl group) were added to 100 parts by weight of the thus obtained carboxyl group containing copolymer and satisfactorily agitated.

Thereafter, 0.4 part by weight of 1,3-bis(N,N-diglycidylaminomethyl)cyclohexane as a crosslinking agent (0.06 mol per mol of carboxyl group) was added to the mixture and satisfactorily agitated, thereby obtaining a pressure sensitive adhesive composition.

Production of Pressure Sensitive Adhesive Sheet

The thus obtained pressure sensitive adhesive composition was applied onto a corona discharged surface of a 110 μm thick polyethylene film so that the coating thickness was 20 μm in the dry state. Thus, a pressure sensitive adhesive sheet having a total thickness of 130 μm was obtained.

The "residual particles", "water washability", "water resistance", "adhesive strength", "impurity ions" and "peel electrification" of this pressure sensitive adhesive sheet were evaluated in the above manners. The results are given in Table 2.

Example 2

A pressure sensitive adhesive composition was obtained in the same manner as in Example 1, except that the monomers were changed to 5 parts by weight of methacrylic acid, 83 parts by weight of 2-methoxyethyl acrylate, 10 parts by weight of butyl acrylate and 2 parts by weight of N,N-dimethylaminoethyl acrylate and that 0.5 part by weight of triethanolamine as a neutralizer (0.15 mol per mol of carboxyl group) was added and agitated and, thereafter, 0.5 part by weight of 1,3-bis(N,N-diglycidylaminomethyl) cyclohexane as a crosslinking agent (0.04 mol per mol of carboxyl group) was added and satisfactorily agitated.

The results are given in Table 2.

Example 3

The same procedure as in Example 1 was repeated except that 0.5 part by weight of N,N-dimethylformamide diethylacetal (0.25 mol per mol of carboxyl group) was used as a neutralizer in place of the triethanolamine.

The results are given in Table 2.

Example 4

The same procedure as in Example 1 was repeated except that the process for preparing a pressure sensitive adhesive composition was changed as follows.

Preparation of Pressure Sensitive Adhesive Composition (1) Production of carboxyl group containing copolymer:

A carboxyl group containing copolymer was obtained in the same manner as in Example 1, except that the monomers were changed to 10 parts by weight of acrylic acid, 85 parts by weight of butyl acrylate and 5 parts by weight of vinyl acetate.

(2) Production of pressure sensitive adhesive composition:

3 parts by weight of triethanolamine as a neutralizer (0.06 mol per mol of carboxyl group) was added to 100 parts by weight of the thus obtained carboxyl group containing copolymer and satisfactorily agitated.

Thereafter, 0.6 part by weight of 1,3-bis(N,N-diglycidylaminomethyl)cyclohexane as a crosslinking agent (0.03 mol per mol of carboxyl group) was added to the mixture and satisfactorily agitated, thereby obtaining a pressure sensitive adhesive composition.

The results are given in Table 2.

Comparative Example 1

The same procedure as in Example 1 was repeated except that the triethanolamine as a neutralizer was not added.

The results are given in Table 2.

Comparative Example 2

A carboxyl containing copolymer composed of 10 parts by weight of methacrylic acid, 60 parts by weight of 2-methoxyethyl acrylate, 20 parts by weight of butyl acrylate and 5 parts by weight of vinyl acetate was produced in the same manner as in Example 1. 45 parts by weight of a toluene solution (solid content: 30% by weight) of polydioxolane (molecular weight: 20 thousand) being a water soluble polymer was added thereto and satisfactorily agitated. Thereafter, 0.5 part by weight of 1,3-bis(N,N-diglycidylaminomethyl)cyclohexane as a crosslinking agent was added to the mixture and satisfactorily agitated, thereby obtaining a pressure sensitive adhesive composition.

The same procedure as in Example 1 was repeated except that use was made of the above pressure sensitive adhesive composition.

The results are given in Table 2.

Comparative Example 3

150 parts by weight of deionized water, 3 parts by weight of polyoxyethylene phenyl ether (surfactant) and 0.5 part by weight of azobisisobutyronitrile were placed in the same four necked flask as employed in Example 1, and the mixture was heated to 75° C. while agitating in a nitrogen atmosphere. A mixture of 10 parts by weight of methacrylic acid and 90 parts by weight of butyl acrylate was dropped thereinto over a period of about 4 hr and the agitation was continued for 3 hr after the completion of the dropping. Thus, a carboxyl group containing emulsion copolymer was obtained. 1.2 parts by weight of hexamethoxymethylmelamine was added thereto and agitated. Further, 40 parts by weight of diethylene glycol monobutyl ether (nonionic surfactant) was added and agitated, thereby obtaining an acrylic emulsion based pressure sensitive adhesive. The same procedure as in Example 1 was repeated except that use was made of the above acrylic emulsion based pressure sensitive adhesive.

The results are given in Table 2.

TABLE 1

| | Carboxyl group containing polymer (A) (parts by weight) | | | | | | |
|---|---|---|---|---|---|---|---|
| | Monomer (a) | | Monomer (b) | | | | |
| | AA | MAA | 2-MEA | BA | DMAEA | VAc | AN |
| Ex. 1 | 3 | — | — | 90 | 7 | — | — |
| Ex. 2 | — | 5 | 83 | 10 | 2 | — | — |
| Ex. 3 | 3 | — | — | 90 | 7 | — | — |
| Ex. 4 | 10 | — | — | 85 | — | 5 | — |
| Compr. Ex. 1 | 3 | — | — | 90 | 7 | — | — |
| Compr. Ex. 2 | — | 10 | 60 | 20 | — | 5 | 5 |
| Compr. Ex. 3 | — | 10 | — | 90 | — | — | — |

| | Neutralizer (B) (parts by weight) | | Crosslinking agent (C) (parts by weight) | | Other components (D) (parts by weight) | |
|---|---|---|---|---|---|---|
| | TEA | DMFAEA | Epoxy | Melamine | D1 | D2 |
| Ex. 1 | 0.5 | — | 0.4 | — | — | — |
| Ex. 2 | 0.5 | — | 0.4 | — | — | — |
| Ex. 3 | — | 0.5 | 0.4 | — | — | — |
| Ex. 4 | 3 | — | 0.6 | — | — | — |
| Compr. Ex. 1 | — | — | 0.4 | — | — | — |
| Compr. Ex. 2 | — | — | 0.5 | — | 45 | — |
| Compr. Ex. 3 | — | — | — | 1.2 | — | 40 |

TABLE 2

| | No. of Residual Particles | | Water washability | | Water resistance Time spent | |
|---|---|---|---|---|---|---|
| | (particles /4" wafer) | Judgement | Time spent for peeling | Judgement | for peeling(hr) | Judgement |
| Ex. 1 | <100 | good | 5 minutes | good | 50 | good |
| Ex. 2 | <100 | good | 5 minutes | good | 60 | good |
| Ex. 3 | <100 | good | 5 minutes | good | 55 | good |
| Ex. 4 | <100 | good | 15 minutes | fair | 100 | good |
| Compr. Ex. 1 | <100 | good | 3 hours | fail | 250 | good |
| Compr. Ex. 2 | >9999 | fail | 30 minutes | fair | 150 | good |
| Compr. Ex. 3 | <100 | good | 22 minutes | fair | 220 | good |

| | Adhesive strength | | | Peel electrification | |
|---|---|---|---|---|---|
| | (g/25 mm) to SUS, JIS | Judgement | Impurity ion Judgement | Electrification voltage (V) | Judgement |
| Ex. 1 | 150 | good | good | <100 | good |
| Ex. 2 | 160 | good | good | <100 | good |
| Ex. 3 | 140 | good | good | <100 | good |
| Ex. 4 | 190 | good | good | <100 | good |
| Compr. Ex. 1 | 180 | good | good | 200 | fair |
| Compr. Ex. 2 | 140 | good | good | <100 | good |
| Compr. Ex. 3 | 130 | good | good | 1000 | fail |

What is claimed is:

1. A pressure sensitive adhesive composition comprising:

(A) a carboxyl group containing copolymer obtained by solution polymerization of (a) a carboxyl group containing polymerizable monomer and (b) another monomer copolymerizable with the monomer (a);

(B) a neutralizer containing neither metal nor halogen; and (C) a crosslinking agent.

2. The pressure sensitive adhesive composition as claimed in claim 1, wherein the other monomer (b) is a compound represented by the formula:

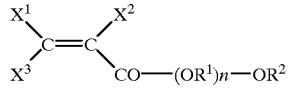

wherein each of $X^1$, $X^2$ and $X^3$ independently represents a hydrogen atom or a methyl group, $R^1$ represents a divalent hydrocarbon group having 2 to 12 carbon atoms, $R^2$ represents a hydrocarbon group having 1 to 10 carbon atoms, and n is a number of 1 to 10.

* * * * *